United States Patent
Chiu et al.

(10) Patent No.: US 6,981,843 B2
(45) Date of Patent: Jan. 3, 2006

(54) AXIAL-FLOW FAN STRUCTURE

(75) Inventors: Yung-yu Chiu, Taichung (TW);
Shun-chen Chang, Taipei (TW);
Kuo-cheng Lin, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 58 days.

(21) Appl. No.: 10/744,376

(22) Filed: Dec. 23, 2003

(65) Prior Publication Data

US 2004/0223848 A1 Nov. 11, 2004

(30) Foreign Application Priority Data

May 5, 2003 (TW) .............................. 92208175 U

(51) Int. Cl.
*F04D 29/24* (2006.01)
*F04D 29/44* (2006.01)
(52) U.S. Cl. ................... 415/220; 416/228; 416/223 B
(58) Field of Classification Search ................ 415/220; 416/228, 223 B, 234
See application file for complete search history.

(56) References Cited

U.S. PATENT DOCUMENTS

| 2,284,141 | A | * | 5/1942 | Funk | 417/423.1 |
| 2,888,188 | A | * | 5/1959 | Hersh | 415/176 |
| 3,274,410 | A | * | 9/1966 | Boivie | 310/62 |
| 5,814,908 | A | * | 9/1998 | Muszynski | 310/62 |

* cited by examiner

*Primary Examiner*—Ninh H. Nguyen
(74) *Attorney, Agent, or Firm*—Pai Patent & Trademark Law Firm; Chao-Chang David Pai

(57) ABSTRACT

An improved axial-flow fan structure is disclosed and claimed, which includes a hub and a plurality of blades. The hub has a top surface and a side surface around which the plurality of blades is mounted. A lateral air intake region is formed above the top surface of the hub and surrounded by edge portions of all of the blades. A lateral air intake surface around the lateral air intake region is constituted by the edge portions of all of the blades. A part of each of the edge portions is fastened to the side surface of the hub.

23 Claims, 5 Drawing Sheets

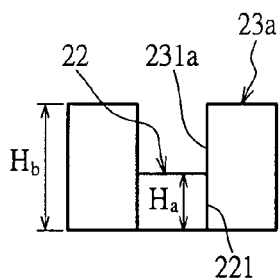
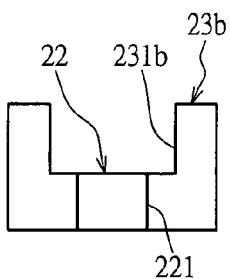
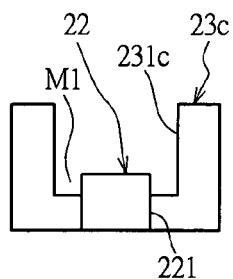
FIG. 6A     FIG. 6B     FIG. 6C
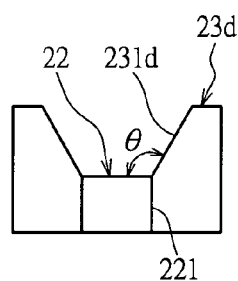
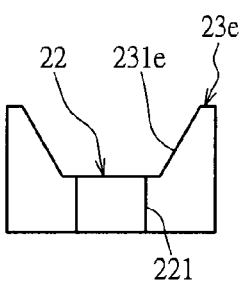
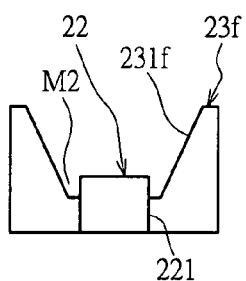
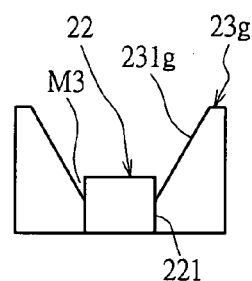
FIG. 6D     FIG. 6E     FIG. 6F     FIG. 6G
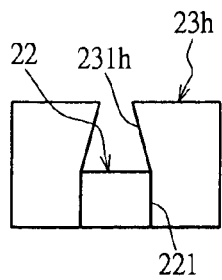
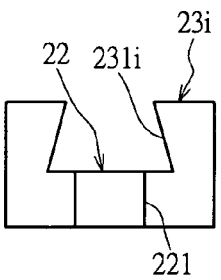
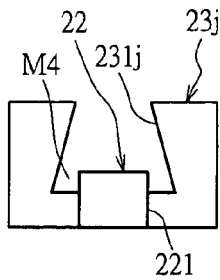
FIG. 6H     FIG. 6I     FIG. 6J

AXIAL-FLOW FAN STRUCTURE

BACKGROUND OF THE INVENTION

1. Field of the Invention

The invention relates to a fan structure and, more particularly, to an axial-flow fan structure capable of directing an air flow sideways.

2. Description of the Related Art

A fan is used to direct air to flow and thus to dissipate heat, and better air directing efficiency results in better heat dissipating efficiency. Usually, there are two types of fans; namely, axial-flow fans and centrifugal fans. In an axial-flow fan, an impeller is rotated to direct an air flow in a direction parallel to the central axis of the impeller. Having advantages of simple structures, lower manufacturing costs, and higher air flow output, axial-flow fans are widely used in air conditioners and heat dissipating devices such as heat-dissipating fans in computer systems. However, the use of axial-flow fans is limited to systems with lower system resistance because the air flow output is restricted, and the stall problem occurs when the system resistance of an axial-flow fan gets larger.

Referring to FIG. 1, the vertical axis and the horizontal axis represent the static pressure and the air flow of an axial-flow fan, respectively. A characteristic curve A of a conventional axial-flow fan intersects a system resistance curve (SRC) C at a point OP, which represents an operation point of the fan. At the point OP, the air flow and the static pressure are $Q_{op}$ and $P_{op}$, respectively. On the other hand, since the boundary layer separation of air may occur on the blade surface when the rotating speed of the fan reaches a certain speed, the air flow cannot be increased even though the rotating speed of the fan is higher. At this time, the variation of the static pressure is smaller, which is known as "stall" of the fan and represented by a line DE in FIG. 1.

Axial-flow fans have advantages of simple structures, lower manufacturing costs, and higher air flow output, and thus play important roles in many engineering applications. However, to solve the stall problem of axial-flow fans, the focus has always been on the design of angles, lengths, and number of the blades; and yet no simple and effective solutions have been found for the problem.

Referring to FIG. 2, an axial-flow fan 1 includes a frame 11, a hub 12, blades 13 and a stator base (not shown). An edge portion 131 of each blade 13 is fastened to a side surface 121 of the hub 12. When the fan 1 rotates, these blades 13 guide the air above the blades 13 to flow downward in an axial direction of a rotation shaft (not shown). For this axial-flow fan 1, however, since the hub 12 has an almost equal height to that of the frame 11, the blades 13 are not able to guide all of the air above the hub 12, and thus a region above the hub 12 becomes ineffective.

BRIEF SUMMARY OF THE INVENTION

The invention provides an improved axial-flow fan to efficiently use the air above the hub of the improved axial-flow fan.

It is therefore an object of the invention to provide an axial-flow fan structure with an improved hub, wherein the air above the hub may be guided sideways by the centrifugal force. Another object of the invention is to provide an axial-flow fan structure with an improved hub to solve the inherent stall problem of the conventional axial-flow fan and greatly enhance the fan efficiency. Thereby, the axial-flow fan structure in accordance with the invention can be applied in systems having higher system resistance.

According to a first aspect of the invention, an axial-flow fan structure includes a hub and a plurality of blades. The hub has a top surface and a side surface around which the plurality of blades are mounted. Each of these blades has an edge portion, which encompasses the top surface of the hub to form a lateral air intake region above the top surface. In addition, all these edge portions together form a lateral air intake surface.

According to a second aspect of the invention, an axial-flow fan structure includes a hub, a plurality of blades and a frame. The hub has a top surface and a side surface, and the blades are mounted around the side surface of the hub. The frame, which has a top boundary and a bottom boundary, receives the hub and the blades. An air intake space is formed among the edges of the blades, the top boundary of the frame and the top surface of the hub. The edge portions of the blades around the air intake space thus define a surrounding surface for guiding the air within the air intake space sideways.

In the axial-flow fan structure of the invention, since the air within the air intake space can be guided sideways by the centrifugal force when the fan rotates, the overall efficiency of the fan can be enhanced. Preferably, the lateral intake air flow effect can be enhanced when the distance from the top end of the fastening portion to the bottom boundary of the fan frame is smaller than three fourths of the height of the fan frame.

The connection relationship between the hub and the blades may have many modifications. For example, the top end of the fastening portion may be substantially flush with or lower than the top edge of the side surface of the hub. Furthermore, a gap may be formed between the edge portion of the blade and the side surface of the hub. Moreover, the edge portion of the blade may extend upward in arbitrary directions from the top end of the fastening portion, or extend radially outward from the top end of the fastening portion first and then upward in arbitrary directions.

Summing up the above, since the fan according to the invention can effectively make use of the air above the hub during the rotation, the air flow and the static pressure can be increased. Furthermore, the stall effect of the fan during operation can be greatly decreased, thereby enhancing the overall efficiency of the fan. Also, because the height of the hub is reduced, the manufacturing cost of the fan can therefore be reduced, and the design of the fan can be simplified.

BRIEF DESCRIPTION OF THE DRAWINGS

FIGS. 6A to 6J are schematic illustrations showing partial cross-sections of the axial-flow fan structures according to ten modified embodiments of the invention.

DETAILED DESCRIPTION OF THE PREFERRED EMBODIMENTS

Figure 1:
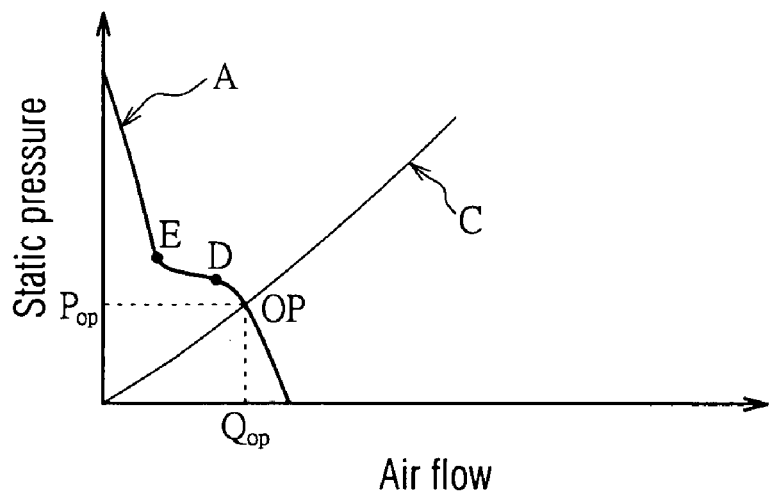
FIG. 1 is a graph showing a general relationship between the static pressure and the air flow of a conventional axial-flow fan.
Figure 2:
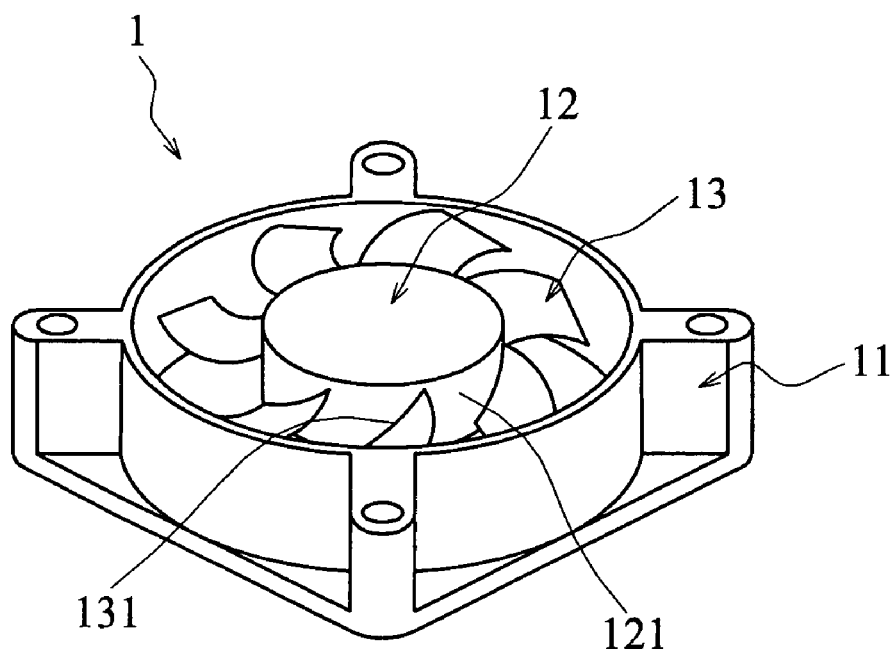
FIG. 2 is a perspective view showing the conventional axial-flow fan.
Figure 3:
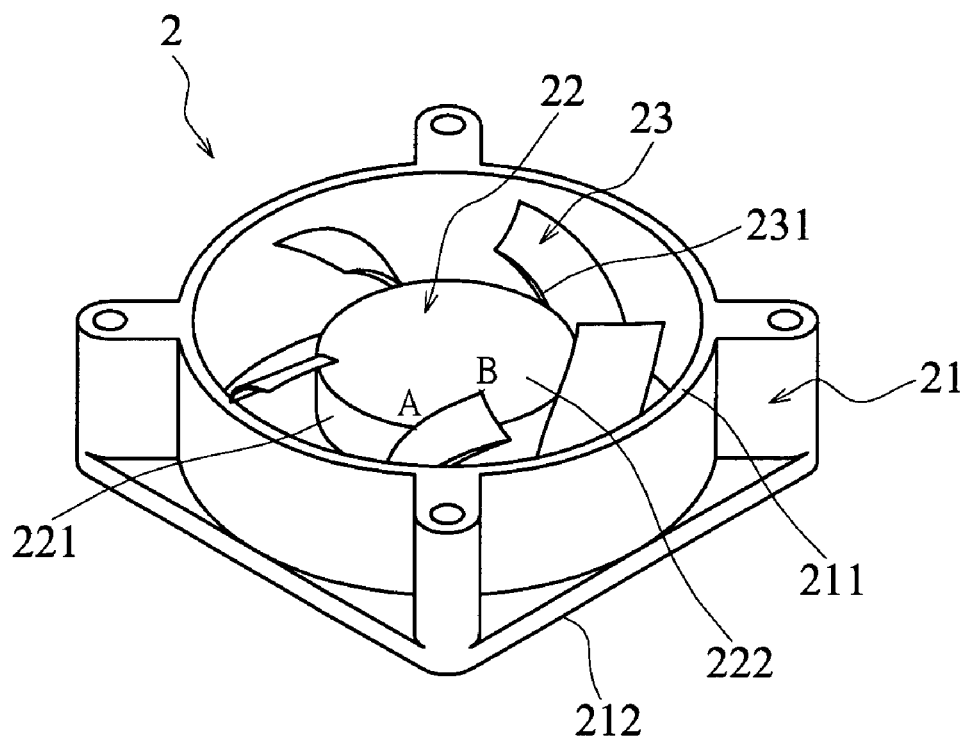
FIG. 3 is a perspective view showing an axial-flow fan according to one embodiment of the invention.
Figure 4:
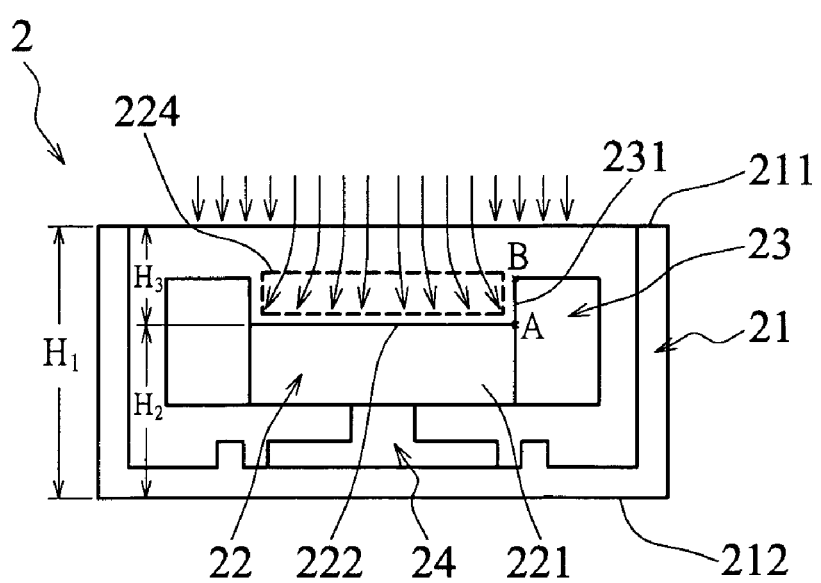
FIG. 4 is a schematic illustration showing a partial cross-section of the axial-flow fan according to one embodiment of the invention.

Referring to FIGS. 3 and 4, the axial-flow fan 2 in accordance with one embodiment of the invention includes a fan frame 21, a cylindrical hub 22, a plurality of blades 23 fastened to a side surface 221 of the hub 22 and aligned around the hub 22, and a stator base 24. The fan frame 21 has a top boundary 211 and a bottom boundary 212 and is for receiving the cylindrical hub 22 and the blades 23. Moreover, a top end A of a fastening portion, between a side surface 221 of the hub 22 and an edge portion 231 of each blade 23 of the axial-flow fan 2, is lower than a top end B of an edge portion 231 of each blade. Accordingly, the region 224 surrounded by all the edge portions 231 of the blades 23 is formed between the top boundary 211 of the fan frame 21 and the top surface 222 of the hub 22 and serves as a lateral air intake region. In addition, the surrounding surface formed by the inner surfaces of all the edge portions 231 serves as a lateral air intake surface to guide air within the lateral air intake region sideways.

When the fan rotates, air streams as indicated by the arrows within the lateral air intake region 224 will be guided along the edge portions 231 and sideways toward the blades 23 by the centrifugal force, and then discharged downward by the blades 23. In other words, the air above the hub 22 is introduced via the lateral air intake surface constituted by the edge portions 231 of the blades 23. FIG. 4 clearly shows the connection relationship between the hub 22, the blades 23, the fan frame 21 and the stator base 24, and the situation in which the air flow above the hub is directed into the fan. It has been proved by experiments that the lateral intake air flow effect can be enhanced when the height $H_2$ between the top end A of the fastening portion and a bottom boundary 212 of the fan frame 21 is smaller than three fourths of the height $H_1$ of the fan frame 21. That is, when the height $H_3$ between a top boundary 211 of the fan frame 21 and the top end A of the fastening portion is equal to or greater than one fourth of the height $H_1$ of the fan frame 21, the lateral intake air flow effect can be enhanced.

On the other hand, the edge portion 231 in this embodiment can be a curved surface. The top end A of the fastening portion between the side surface 221 and the edge portion 231 is substantially flush with a top edge of the side surface 221 of the hub 22. The top surface 222 of the hub 22 and the side surface 221 have a plane shape and a circular arc shape, respectively.

Figure 5:
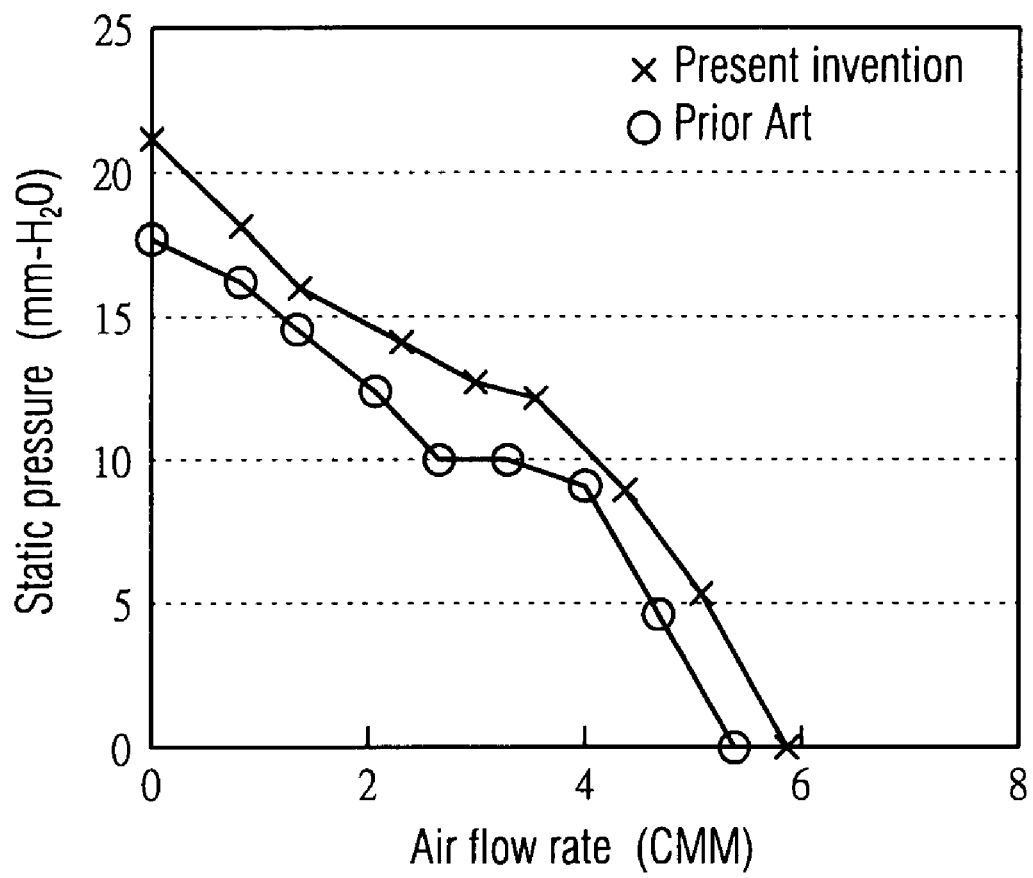
FIG. 5 is a graph showing the relationship between the static pressure and the air flow according to the axial-flow fan of one embodiment of the invention and the prior art axial-flow fan under the same operating condition.

The following table 1 shows experimental data of the static pressure and the air flow of the axial-flow fan structures in accordance with one embodiment of the invention and the prior art under the same operating condition. A graph showing the relationship between the static pressure and the air flow rate is depicted in FIG. 5 according to these data. In FIG. 5, compared with the prior art, the static pressure and air flow of the axial-flow fan structure of the invention are higher and the stall is compensated.

TABLE 1

| Condition Rotating Speed (R.P.M) Power (V, I) Test set | Axial-flow fan structure (prior art) 4000 48 V, 0.50 A | | Axial-flow fan structure (an embodiment of the invention) 4000 48 V, 0.50 A | |
| --- | --- | --- | --- | --- |
| | Static Pressure (mm H$_2$O) | Air Flow Rate (CMM) | Static Pressure (mm H$_2$O) | Air Flow Rate (CMM) |
| 1 | 0 | 5.38 | 0 | 5.85 |
| 2 | 4.75 | 4.64 | 5.39 | 5.05 |
| 3 | 14.59 | 1.32 | 16.03 | 1.35 |
| 4 | 16.26 | 0.81 | 18.01 | 0.87 |
| 5 | 17.78 | 0 | 21.14 | 0 |

The axial-flow fan structure in accordance with the embodiment of the invention is illustrated to embody but not to limit the invention. For instance, the connection relationship between the hub and the blades can vary with different conditions.

FIGS. 6A to 6J are cross-sectional views schematically showing the connection relationships between the hub 22 and the blades 23a to 23j of axial-flow fans. The hub 22, which is the same as that of FIG. 3, is cylindrical and has a plane top surface and a circular arc side surface. On the other hand, the height $H_a$ of the top end of the fastening portion between the hub 22 and the edge portion 231a, and the height $H_b$ of the blades 23a to 23j are smaller than the height (not shown) of the fan frame, and $H_b$ is greater than $H_a$.

As shown in FIGS. 6A and 6B, the top end of the fastening portion between the hub 22 and the blade 23a is substantially flush with the top edge of the side surface 221 of the hub. The edge portion 231a of the blade 23a extends vertically upward from the top end of the fastening portion. Alternatively, the edge portion 231b of the blade 23b extends radially outward from the top end first and then vertically upward.

As shown in FIG. 6C, the top end of the fastening portion between the hub 22 and the blade 23c is substantially lower than the top edge of the side surface 221 of the hub. The edge portion 231c of the blade 23c extends radially outward from the fastening portion first and then vertically upward, and thus allows a gap M1 formed between the edge portion 231c and the side surface 221 of the hub, and defines an approximately cylindrical outlined lateral air intake region above the hub 22.

As shown in FIGS. 6D and 6E, the top end of the fastening portion between the hub 22 and the blade 23d is substantially flush with the top edge of the side surface 221 of the hub. The edge portion 231d of the blade 23d extends obliquely upward from the top end of the fastening portion, and thus defines an approximately conical outlined lateral air intake region above the hub 22. Alternatively, the edge portion 231e of the blade 23e extends radially outward from the top end first and then obliquely upward, and thus defines an approximately conical outlined lateral air intake region above the hub 22.

As shown in FIGS. 6F and 6G, the top end of the fastening portion between the hub 22 and the blade 23f is substantially lower than the top edge of the side surface 221 of the hub. The edge portion 231f of the blade 23f extends radially outward from the fastening portion first and then obliquely upward, and thus allows a gap M2 formed between the edge portion 231f and the side surface 221 of the hub, and defines an approximately conical outlined lateral air intake region above the hub 22. Alternatively, the edge portion 231g of the blade 23g extends obliquely upward from the fastening portion, and thus allows a gap M3 formed between the edge portion 231g and the side surface 221 of the hub, and defines an approximately conical outlined lateral air intake region above the hub 22.

As shown in FIGS. 6H and 6I, the top end of the fastening portion between the hub 22 and the blade 23h is substantially flush with the top edge of the side surface 221 of the hub. The edge portion 231h of the blade 23h extends inwardly from the top end of the fastening portion and obliquely upward, and thus defines an approximately conical outlined lateral air intake region above the hub 22 surrounded by the edge portions 231h. Alternatively, the edge portion 231i of the blade 23i extends radially outward from the top end first and then inwardly and obliquely upward, and thus defines an approximately conical outlined lateral air intake region above the hub 22.

As shown in FIG. 6J, the top end of the fastening portion between the hub 22 and the blade 23j is substantially lower than the top edge of the side surface 221 of the hub. The edge portion 231j of the blade 23j extends radially outward from the fastening portion first and then inwardly and obliquely upward, and thus allows a gap M4 formed between the edge portion 231j and the side surface 221 of the hub, and defines an approximately conical outlined lateral air intake region above the hub 22.

It should be noted that in the axial-flow fan structures as shown in FIGS. 6A to 6J, the angle (e.g., θ in FIG. 6D) between any one of the edge portions 231a to 231j of the blade and the top surface of the hub 22 can be any suitable angles. In addition, each of the edge portions 231a to 231j is not limited to a vertically upward extending surface but can be a curved surface, an irregular surface, or a surface of any shape, provided that $H_b$ is greater than $H_a$.

Figure 7A:
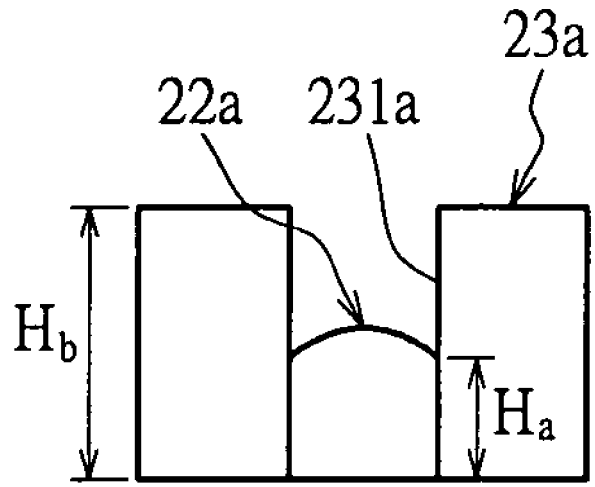
FIGS. 7A to 7B are schematic illustrations showing partial cross-sections of the axial-flow fan structures according to other modifications of the invention.
Figure 7B:
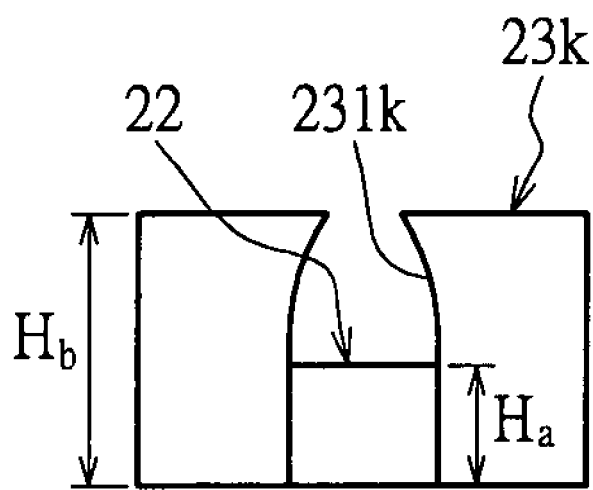

On the other hand, the top surface of the hub is not limited to a plane but can be a curved surface, for example, the curved surface as shown in FIG. 7A, as long as the height $H_a$ of the top end of the fastening portion, and the height $H_b$ ($H_b>H_a$) of the blades 23a to 23j are smaller than the height (not shown) of the fan frame. The curved shape of the top surface does not interfere with the effect of the lateral intake air flow above the hub. Moreover, as shown in FIG. 7B, the edge portion of the blade of the axial-flow fan structure of the invention is not limited to a plane but can be a curved surface, such as the edge portion 231k of the blade 23k.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An axial-flow fan structure, comprising:
   a hub having a top surface and a side surface; and
   a plurality of blades, each of the blades having a top portion, an edge portion and a fastening portion, wherein:
   the fastening portion of each of the blades is fastened to the side surface of the hub such that the blades are connected to the hub;
   a lateral air intake region is formed above the top surface of the hub;
   a lateral air intake surface around the lateral air intake region is constituted by the edge portions of all of the blades and utilized for guiding air within the lateral air intake region sideways; and
   a frontal air intake region is formed above the top portions of the blades.

2. The axial-flow fan structure according to claim 1, wherein a top end of the fastening portion of each of the blades is flush with a top edge of the side surface of the hub.

3. The axial-flow fan structure according to claim 1, wherein a top end of the fastening portion of each of the blades is lower than a top edge of the side surface of the hub.

4. The axial-flow fan structure according to claim 3, wherein a gap is formed between each of the edge portions of the blades and the side surface of the hub.

5. The axial-flow fan structure according to claim 1, wherein each of the edge portions of the blades has a plane or curved surface.

6. The axial-flow fan structure according to claim 1, wherein the lateral air intake region has a cylindrical or conical shape.

7. The axial-flow fan structure according to claim 1, wherein the top surface of the hub has a plane or curved shape.

8. The axial-flow fan structure according to claim 1, wherein the side surface of the hub has a circular arc shape.

9. An axial-flow fan structure, comprising:
   a hub having a top surface and a side surface;
   a plurality of blades, each of the blades having an edge portion and a fastening portion; and
   a frame, which has a top boundary and a bottom boundary, for receiving the hub and the blades, wherein
   the fastening portion of each of the blades is fastened to the side surface of the hub such that the blades are connected to the hub;
   an air intake space is formed among the edge portions of the blades, the top boundary of the frame and the top surface of the hub, and
   a surrounding surface, which is around the air intake space and constituted by the edge portions of the blades, is utilized for guiding air within the air intake space sideways.

10. The axial-flow fan structure according to claim 9, wherein the vertical distance from a top end of the fastening position of each blade to the bottom boundary of the frame is smaller than three fourths of the height of the frame.

11. The axial-flow fan structure according to claim 9, wherein the vertical distance from a top end of the fastening portion of each blade to the upper boundary of the frame is at least one fourth of the height of the frame.

12. The axial-flow fan structure according to claim 9, wherein a top end of the fastening portion of each blade is flush with a top edge of the side surface of the hub.

13. The axial-flow fan structure according to claim 9, wherein a top end of the fastening portion of each blade is lower than a top edge of the side surface of the hub.

14. The axial-flow fan structure according to claim 13, wherein a gap is formed between each of the edge portions of the blades and the side surface of the hub.

15. The axial-flow fan structure according to claim 9, wherein each of the edge portions of the blades has a plane or curved surface.

16. The axial-flow fan structure according to claim 9, wherein the air intake space has a cylindrical or conical shape.

17. The axial-flow fan structure according to claim 9, wherein the side surface of the hub has a circular arc shape.

18. The axial-flow fan structure according to claim 9, wherein the top surface of the hub has a plane or curved surface.

19. An axial-flow fan structure, comprising:

a hub having a top surface and a side surface; and a plurality of blades, connected to the side surface of the hub, wherein each blade has a top portion higher than the top surface of the hub to form an axial air intake region, and an edge portion adjacent to the top surface of the hub to form a lateral air intake region with the top surface of the hub.

20. The axial-flow fan structure according to claim 19, wherein the edge portion of each blade and the top surface of the hub forms an angle greater than, equal to, or less than 90 degrees.

21. The axial-flow fan structure according to claim 19, wherein the edge portion of each blade is linear, curved, or inclined.

22. The axial-flow fan structure according to claim 19, wherein the top surface of the hub is planer or curved.

23. The axial-flow fan structure according to claim 19, wherein one end of the edge portion, connected to the hub, of the blade is lower than the top surface of the hub.

* * * * *